United States Patent [19]
Carson et al.

[11] Patent Number: 4,646,128
[45] Date of Patent: * Feb. 24, 1987

[54] HIGH-DENSITY ELECTRONIC PROCESSING PACKAGE—STRUCTURE AND FABRICATION

[75] Inventors: John C. Carson, Corona del Mar; Stewart A. Clark, Irvine, both of Calif.

[73] Assignee: Irvine Sensors Corporation, Costa Mesa, Calif.

[*] Notice: The portion of the term of this patent subsequent to Nov. 5, 2002 has been disclaimed.

[21] Appl. No.: 720,902

[22] Filed: Apr. 8, 1985

Related U.S. Application Data

[60] Division of Ser. No. 517,221, Jul. 25, 1983, Pat. No. 4,525,921, which is a continuation-in-part of Ser. No. 282,459, Jul. 13, 1981, abandoned, which is a continuation of Ser. No. 187,787, Sep. 16, 1980, abandoned.

[51] Int. Cl.⁴ .................................... H01L 23/48
[52] U.S. Cl. .................................... 357/74; 250/370; 250/578
[58] Field of Search .......... 174/68.5; 250/332, 370 G, 250/578; 357/56, 75, 74; 361/396, 414

[56] References Cited

U.S. PATENT DOCUMENTS

| | | | |
|---|---|---|---|
| 3,748,479 | 7/1973 | Lehovec | 250/553 |
| 4,283,755 | 8/1981 | Tracy | 361/414 |
| 4,500,905 | 2/1985 | Shibata | 357/68 |
| 4,551,629 | 11/1985 | Carson et al. | 250/578 |

*Primary Examiner*—James W. Davie
*Attorney, Agent, or Firm*—Thomas J. Plante

[57] ABSTRACT

A high-density electronic package module is disclosed which comprises a stack of semiconductor chips having integrated circuitry on each chip. To permit the emplacement of thin film circuitry on the access ends, each access plane is etched to cut back the semiconductor material then covered with passivation material, and thereafter lapped to uncover the ends of electrical leads on the chips.

14 Claims, 11 Drawing Figures

FIG. 5
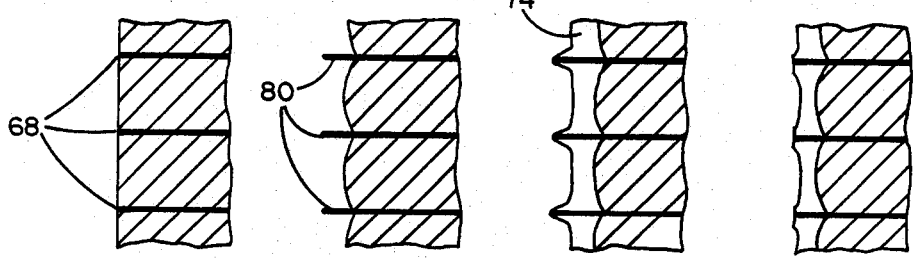
FIG. 5a  FIG. 5b  FIG. 5c  FIG. 5d
FIG. 7
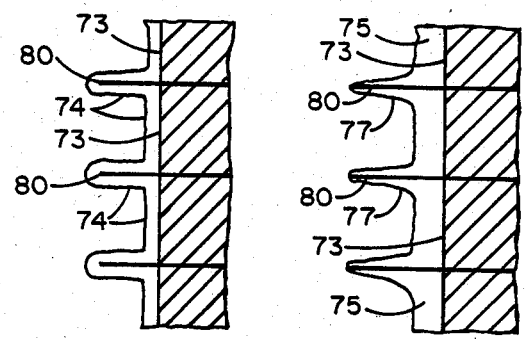
FIG. 7a  FIG. 7b

HIGH-DENSITY ELECTRONIC PROCESSING PACKAGE—STRUCTURE AND FABRICATION

This application is a division of application Ser. No. 517,221, filed July 25, 1983, U.S. Pat. No. 4,525,921, which is a continuation-in-part of application Ser. No. 282,459, filed July 13, 1981 (now abandoned), which itself was a continuation of application Ser. No. 187,787, filed Sept. 16, 1980 (now abandoned).

BACKGROUND OF THE INVENTION

This invention relates to high-density electronic packaging which permits a maximum number of circuit elements to be included in a small volume and to be easily interconnected with other portions of a system. It might be used in computer applications, in optical/electronic combinations, in space division switching networks, or any other environment where high density and easy accessing of electronic circuitry is desired.

More specifically, this invention relates to the packaging of parallel signal processing channels on centers as small as 0.002 in. with vacuum-deposited input and output conductor patterns. Input and output can also be optical; i.e., an image pattern in, processing on a per pixel basis, and a processed image pattern out. Processing functions in the package can include amplification, bandpass filtering, thresholding, digitization, multiplexing, frame-to-frame and channel-to-channel comparison, etc.

Some of the primary considerations in developing improved high density electronic packaging modules are:

(1) Optimizing packing density to achieve the lowest possible mass per element, essentially the smallest module that is production worthy;
(2) Assuring end-to-end continuity of the electrical leads;
(3) Simplifying the fabrication procedures;
(4) Enhancing the structural strength of the elements;
(5) Improving reliability of the electronics and of the techniques for interconnecting the electronics with the electrical leads;
(6) Maximizing suitability for test and repair at the lowest level of assembly and throughout assembly; and
(7) Minimizing the cost per element.

It is the general purpose of the present invention to make a major improvement in the apparatus and method designed to attain the listed objectives.

SUMMARY OF THE INVENTION

The present invention provides an electronics package primarily constituted by a stack of semi-conductor (preferably silicon) chips, or substrates, extending in layers at right angles to one or more access planes, with each chip having thereon: (a) integrated circuitry which provides a significant amount of electronic processing, (b) electrical leads extending to the access planes and (c) suitable insulation on the access planes which exposes the separate electrical leads to make them individually available for electrical connection to other portions of the system in which the package is included.

Another important aspect of the present invention is the method of successfully forming the layered stack of semiconductor chips, including solutions to such problems as: (a) providing separately accessible leads on the insulated access planes, (b) connecting the leads on the access planes to their appropriate conductors without using wire bonding, and (c) properly stacking and aligning the chips in the package.

Other more specific features of both the product and method of the present invention will also be disclosed and claimed in this application.

BRIEF DESCRIPTION OF THE DRAWINGS

FIGS. 5A through 5D are cross-sectional closeups of several layers of silicon chips, illustrating the step-by-step processing used to insulate the front and back surfaces of the modules in such a way as to provide individually exposed multiple electrical leads on each surface;

FIGS. 7A & B are greatly enlarged views illustrating the differences between the results of two types of access plane insulating processes.

DETAILED DESCRIPTION OF SPECIFIC EMBODIMENTS

Figure 1:
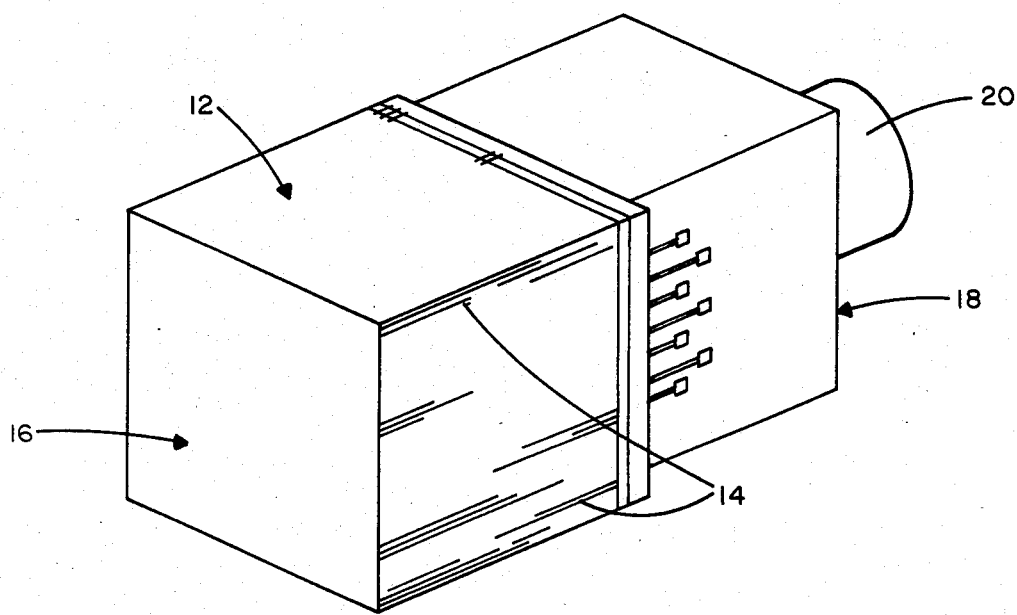
FIG. 1, which is identical with FIG. 1 of each of the parent applications relating to focal plane mosaic photodetector arrays, is a view in perspective of a module comprising a number of stacked silicon chips, each of which provides an integrated circuit terminating in a multiplicity of electrical leads at the front end (focal plane) of the module, and a plurality of electrical leads at the rear end (lead-out plane) of the module.

FIG. 1 shows a module 12 comprising a multiplicity of layers 14, each of which is a semiconductor chip (preferably silicon) which carries an integrated circuit having suitable electrical leads terminating at an access plane 16 which, in a photo-detector module, is a front, or focal, plane, on which such leads may be in electrical contact with separate very closely spaced photo-detectors. The module 12 is, in effect, a stack, or "sandwich", comprising numerous silicon chips, or substrates, secured together by suitable adhesive material between adjacent chips. The shape of the stack may be described as a rectangular parallelepiped, because each of its surfaces is rectangular. In some cases it may be essentially cubic. The stack of chips is mounted on a supporting block 18, which also functions as a heat-transfer, or cooling, structure, and which may have a mounting stud 20 for use in securing the module and its supporting block in a larger assembly. Generally the combination of the stack of silicon chips and the supporting block is considered to be a module assembly.

Figure 2:
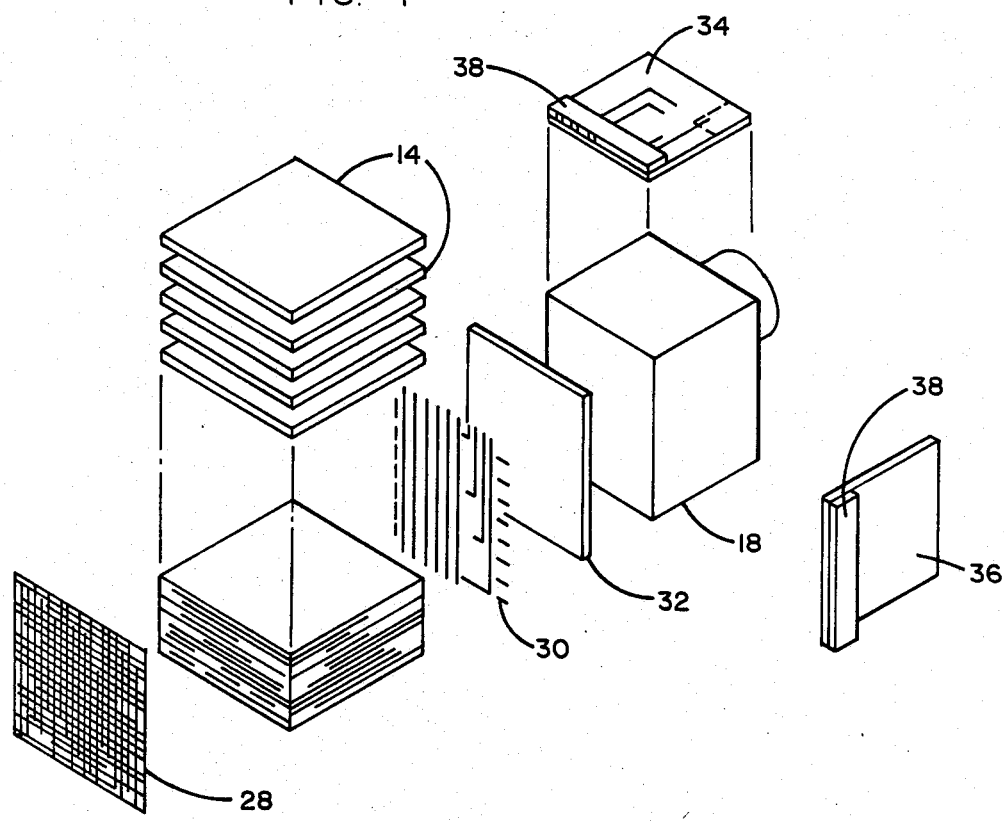
FIG. 2 is an exploded view of the detector module shown in FIG. 1.

Referring now to FIG. 2, which is an exploded view of a module 12, it is seen that it includes separately formed silicon chips 14 which, after being stacked and glued together, are provided on their front, or focal, plane with a detector "mosaic" 28, and on their rear, or back, plane with back plane wiring 30. The supporting block 18 may be molybdenum, selected because of its thermal compatibility with silicon. It is insulated from the back plane of the silicon substrate stack by a flat insulating board 32, preferably formed of silicon, having silicon oxide grown or deposited on its surfaces. Two additional insulating boards 34 and 36, also preferably formed of silicon, are secured to two sides of molybdenum block 18, and are arranged to carry lead-out conductors from the back plane wiring 30 to the ribbon cables 26. Each of the insulating boards 34 and 36 has an insulating strip 38 secured thereto.

Figure 3:
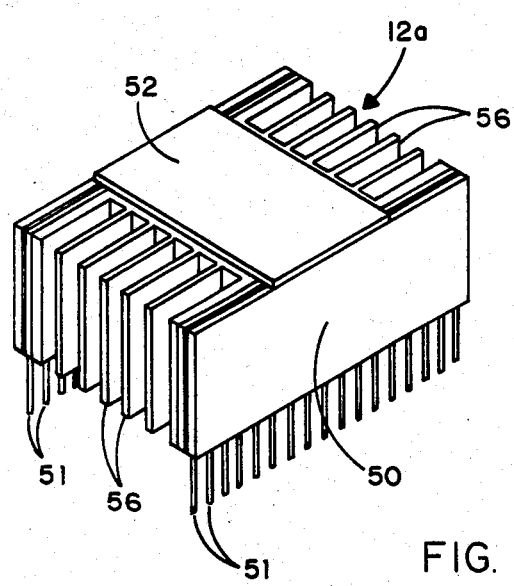
FIG. 3 is a view in perspective of a high-density electronics packaging module similar to that shown in FIGS. 1 and 2, but intended for use in different environments, such as computer systems.
Figure 4:
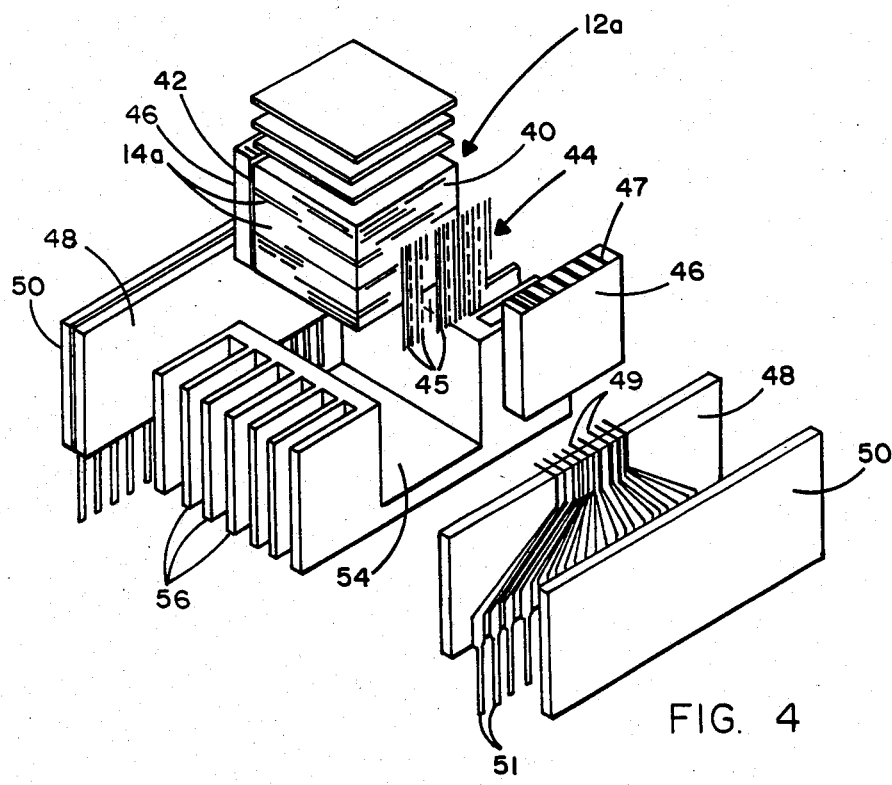
FIG. 4 is an exploded view of the module shown in FIG. 3.

FIGS. 3 and 4 show a module designed for computer use. As seen in FIG. 4, a module, or stack, 12a of silicon (or other semiconductor) chips, or layers, 14a is secured together to form a high-density electronic package, each chip 14a having integrated circuitry on its surface. This stack, like the one in FIG. 1, is a rectangular parallelepiped.

The module, or stack, 12a is designed to have two conductor access planes 40 and 42, preferably located at opposite ends of the stack. On each of the access planes 40 and 42, end plane wiring 44 is provided, which connects the integrated circuitry on the chips to electrical conductors leading into and out of the package. This end plane wiring is provided by a photolithographic metal deposition and etching process. Preferably the end plane wiring 44 is in the form of stripes 45 extending perpendicular to the planes of the chips, each stripe crossing the junctions between a plurality of chips, where it makes electrical contact with metal conductor leads on the chips. This perpendicularity of stripes to chips is very useful, because it insures contact of the wiring stripes with the appropriate conductor leads without regard to differences (tolerances) in the thickness of the chips.

As shown in FIG. 4, there are three flat insulator members—46, 48 & 50—covering each access plane 40 and 42. The upper edge of insulator member 46 has electrical leads 47 which connect the upper edges of wiring stripes 45 to leads 49 formed on insulator member 48, which in turn are in electrical contact with lead-out connectors 51 sandwiched between insulator members 48 and 50.

As shown in FIG. 3, the assembled package has the lead-out connectors 51 available for connection to other parts of the system. The stack of chips is enclosed by insulator members, including top and bottom members 52; but it has a metallic supporting frame 54 (from which top and bottom chips are insulated by a suitable layer or layers of $SiO_x$). The metallic supporting frame 54 has cooling fins 56 for the purpose of dissipating heat generated in the electronic package. The problem of avoiding excessive temperatures is also solved by using circuitry having low power requirements. For this purpose complementary MOSFET (CMOS) transistors are preferred, because power is only required during transition, i.e., continuous current flow is minimal.

FIGS. 5A to 5D illustrate a highly significant aspect of the processing which makes it possible to build the stacked silicon modules successfully. This process has been used effectively on both access planes of the modules, for the purpose of providing an insulating surface which does not cover the ends of the electrical leads but otherwise fully covers the end surfaces of the stacked silicon chips. Since the silicon substrate is a doped semiconductor, any failure to insulate any of its exposed surfaces will lead to short circuits.

Figure 6:
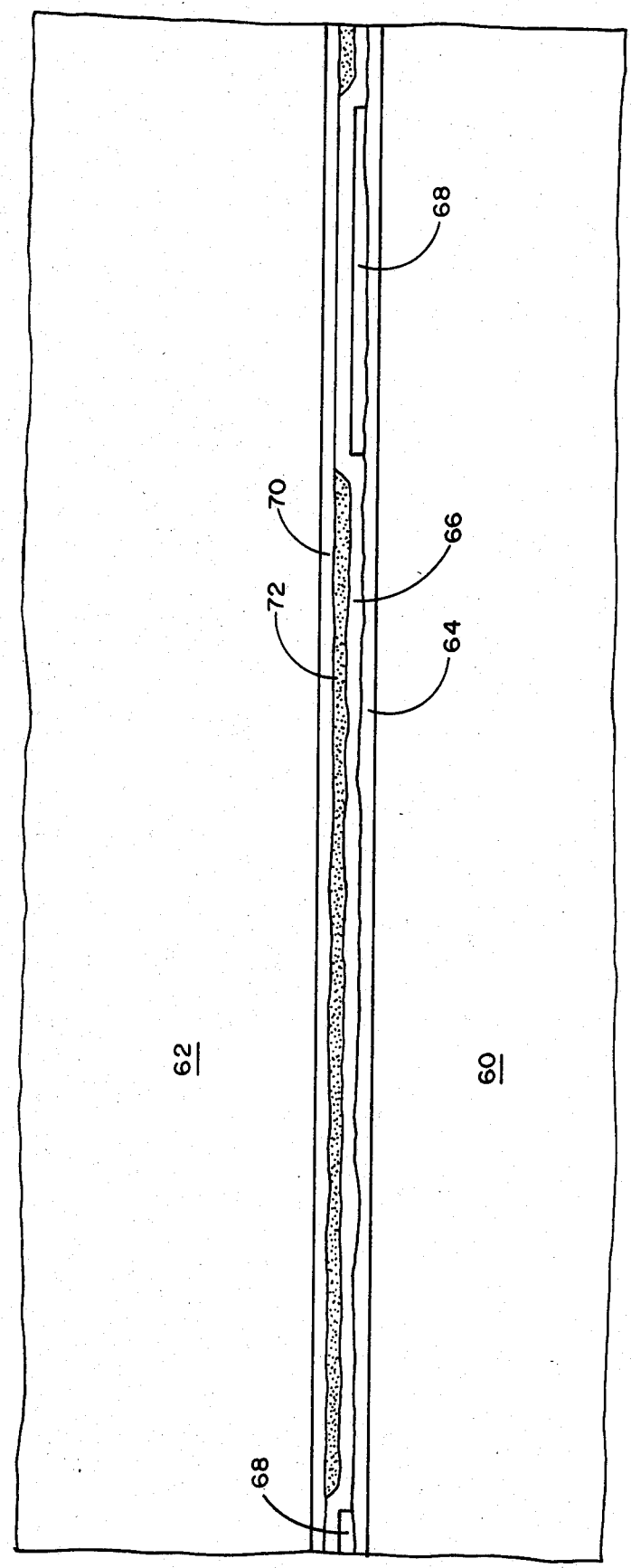
FIG. 6 is a greatly magnified cross-section showing the individual electrical leads and the intersection of two of the stacked silicon chips.

Before explaining the unique process, the steps of which are illustrated in FIG. 5, it will be useful to understand clearly the final result which must be achieved. FIG. 6 is a greatly magnified cross-section showing the individual electrical leads and the intersection of two stacked silicon chips.

In FIG. 6 a lower silicon chip, or substrate, is indicated at 60, and an upper silicon chip, or substrate, is indicated at 62. The lower chip 60 has two thin layers of silicon oxide ($SiO_x$) which insulate the upper planar surface of the chip. A first layer 64 is located directly on the upper surface of the chip; a second layer 66 is provided to cover the metal leads, one of which is identified by the numeral 68. The metal leads 68 are formed as part of the integrated circuitry on the chip.

As seen in FIG. 6, the second $SiO_x$ layer 66 has undulations in its profile because it covers the leads 68. These layers of insulation are either grown on, or deposited on, the original silicon wafer by the supplier, who also provides the integral individual electric leads 68 lying on top of the lower silicon oxide layer 64. Preferably the upper chip 62 also has a thin layer of silicon oxide 70 which insulates the lower planar surface of chip 62. This layer of insulation 70 is not formed on the original silicon wafer, but is applied by deposition just before the chip is laminated into the module stack. An epoxy layer 72 is used to glue the chips 60 and 62 together. Forcing the chips together during the stacking process tends to displace the epoxy from the space occupied by the metal leads 68; so the epoxy is located between the leads, as shown. A type of epoxy which has proved suitable for the gluing of the silicon chips is unfilled Epotek H77.

A fundamental problem which must be solved, and which has proved very difficult to solve, in order to successfully use stacked silicon chips, is the passivation of the access plane edges of the chips. This layer of passivation should fully cover the ends of chips 60 and 62 without covering the metal conductors 68, which must be in electrical contact with the end plane wiring.

Two available but unsatisfactory methods for insulating the access plane ends of the stacked chips completely, except for the ends of the leads, are (a) thermal growth of native silicon oxide selectively on the silicon and (b) photolithographic methods of selectively etching holes through a deposited insulating coating to expose the ends of the leads. Selective growth of the native oxide is not possible because high temperatures and/or high voltages would degrade other materials in the completed structure, such as the adhesive, lead metallization, and low level circuits. Photolithographic techniques are not feasible because the accuracies of the dimensions between adjacent rows of the leads are determined in part by wafer lapping accuracy. The very small pad overlap at the lead end permitted by the thin passivation layers 64, 66 and 70 applied to the original silicon wafers requires lead placement tolerances smaller than can be obtained by lapping and stack fabrication techniques.

The unique method developed to cover the focal plane ends of the stacked chips completely with an insulation layer, except for the ends of the leads 68, is best understood with reference to FIGS. 5A to 5D. In FIG. 5A, a stack of silicon chips (part of a module) is shown in cross section, with metallic leads 68 therebetween (insulation between layers is not shown). The left end of the module should be lapped, in order to provide a smooth access plane surface and insure that the leads 68 are exposed.

The next step is to etch the edges of the silicon chips. In FIG. 5B, the left (focal plane) edges of the chips have been etched to remove the silicon to a depth of about 0.0005 inch, causing the etch-resistant ends 80 of the leads 68 to protrude, as shown. After that, as shown in FIG. 5C, the passivation layer 74 is deposited on the access plane ends of the stacked chips. And finally, as illustrated in FIG. 5D, the left end of the stacked chip module is lapped, preferably with a relatively soft lapping compound, in order to uncover the tips of leads 68 without removing the passivation layer 74 from the edges of the silicon chips.

The effective performance of the method illustrated in FIGS. 5A to 5D has proved to be very difficult to accomplish, primarily because of the necessity that the ends 80 of the leads 68 protrude as straight as possible after removal of the silicon material. If the ends of the leads bend, they will "shadow" the adjoining silicon area during passivation, thereby tending to cause a short circuit to the silicon from metallization applied over the passivation. The leads 68 are normally only 1–3 microns thick, because they are formed as part of the integrated circuitry on each chip. This extreme smallness, and the resulting fragility of the leads, is necessitated by the chip manufacturing parameters resulting from the fact that the metal of the leads has a different expansion coefficient from the silicon. In other words, if the leads were made heavier, in order to reduce this fragility, the difference in expansion between the substrate and the leads, over the range of temperatures between processing temperatures and operating temperatures, would cause stresses to build in the metal/silicon interface, resulting in de-lamination of the leads from the substrate.

Because of the fragility of the metal leads, the etching step should be accomplished by a dry process. Use of a liquid etching material tends to cause swelling of the epoxy, which can cause crumbling of the protruding metal leads.

In order to accomplish dry etching, a plasma etching step (isotropic) in a vacuum chamber may be used. The plasma process achieves etching through the use of an excited gas plasma which eliminates the need for wet chemical etchants. The stacked chips to be etched are loaded in a planar reaction chamber and the lid is closed. Air is then pumped out of the chamber to create a vacuum. The etch gas is introduced into the chamber at a constant rate, and power is applied to ionize the gas. The gas forms chemically active radicals which react with photo-resist-free substrate surfaces to accomplish the etching.

Because the plasma etching removes silicon from the end of each chip at about twice the rate at which the silicon oxide between chips is removed, the remaining silicon oxide tends to provide support for the metal leads prior to application of the passivation (insulation) material on the ends of the chips. However, the leads can be self-supporting if the silicon is not etched too deeply.

The preferred insulation material is a curable liquid polymer material which can be applied evenly to the ends of the stacked chips. The use of liquid which is applied (by a process such as spinning it on), and then cured, permits a thicker build-up of the insulation material on the ends of the silicon chips, thus providing a better insulation layer and more effective insulation between the metal leads and the adjacent silicon material. Also, the process deposits less insulating material on the metal leads, which simplifies the subsequent uncovering of the leads. The preferred curable liquid polymer material is polyimide, which is thermally cured after being spun on, using standard processes.

Prior to development of the polyimide passivation technique, the insulating method used was vacuum deposition of $SiO_x$. This was done by evaporating SiO in a vacuum chamber (in which the module had been placed), while bleeding $O_2$ into the chamber. The resulting silicon oxide layer included both SiO and $SiO_2$. Other insulation-layer-adding possibilities have been considered and/or tried. A passivation epoxy, such as Epotek H77, has been tried, but it was not satisfactory because of a tendency to "peel away" from the silicon. Silicon nitride ($Si_3N_4$) would be an effective insulation material because it provides a tougher film. However, the normal processes by which a layer of silicon nitride would be formed would be either sputtering, or growing the layer on the silicon of the chips. Sputtering was not considered desirable primarily because sputtering equipment was not conveniently available. Growing the insulation material is not feasible because the electrical energy and/or heat involved in such a process might damage the circuitry on the chips. Except for this consideration, it would appear that an ideal solution to the passivation layer problem would be to anodize the silicon to form passivation on the silicon only, without covering the metal leads.

As stated above, an advantage of the use of the cured liquid polymer over the vacuum-deposited $SiO_x$ is the feasibility of providing a thicker insulation layer on the silicon surface, while at the same time reducing the insulation which covers the metal leads. FIGS. 7A & B illustrate the difference. 7A shows the passivation material applied by vacuum deposition; 7B shows the passivation material applied as a spun-on liquid and then cured. As seen in FIG. 7A, the shape of the passivation material 74 on the end surfaces 73 of the silicon chips, and on the protruding metal leads 80, is "conformal", i.e., the vacuum-deposited thickness tends to be substantially equal at all locations. As seen in FIG. 7B, showing the results of applying (and curing) a liquid polymer (polyimide), the thickness of the passivation material 75 on the end surfaces 73 of the silicon chips is much greater than its thickness 77 on the protruding metal leads 80. This occurs because the liquid polymer is self-levelling on the end surfaces 73, and is non-conformal, as distinguished from the vacuum-deposited material. Thus, the liquid polymer passivation process has the dual benefit of (a) providing thicker insulation covering the silicon, where it is needed, and (b) providing thinner coverage on the metal leads, from which it is subsequently removed.

Another major problem encountered in providing a functional module of stacked silicon chips is the connection of access plane wiring. It is highly desirable to avoid the use of wire bonding techniques because of the real estate required and because of the processing complexities. It is also desirable to avoid using any electrical connections which require extending leads around the edges, or corners, of their supporting substrates. This is true because buildup of photo-resist on the corners, during a metallization-depositing process, is likely to cause shorting leads along the substrate edges. Therefore, it is desired to provide metallization 30 of FIG. 2 and metallization 44 of FIG. 4 by using thin film processing to deposit such metallization on each access plane of the stacked silicon chips. Such metallization must be in effective electrical contact both with the appropriate leads on the edges of the chips, and with the electrical leads which connect to the external (off-focal-plane) electronic circuitry.

After completion of the lapping-etching-passivating-lapping sequence described above, each access plane will have a large number of uncovered, accessible metallic leads 68 intersecting the access plane. Next, metallizing steps are used to form "T-shaped" electrical junctions at the access plane. This is accomplished by depositing conductor stripes on the access plane on top of the plane-intersecting ends of the electrical leads. It is considered important that the metal stripes overlap the ends of the leads by at least 0.0005 to 0.001 inch, thus forming a "T" which insures good electrical contact.

The metallization 30 (in FIG. 2) and 44 (in FIG. 4), which is formed on the access plane by any suitable technique, such as photo-delineation followed by etching, includes a plurality of conductor stripes, each of which overlies, and is in contact with, the appropriate group of leads on the access plane.

From the foregoing description, it will be apparent that the devices disclosed in this application will provide the significant functional benefits summarized in the introductory portion of the specification.

The following claims are intended not only to cover the specific embodiments disclosed, but also to cover the inventive concepts explained herein with the maximum breadth and comprehensiveness permitted by the prior art.

What is claimed is:

1. A high-density electronic package comprising:
   a plurality of integrated-circuit-providing semiconductor substrates of substantially identical dimensions stacked and secured together to form a multiple layer structure having the shape of a rectangular parallelepiped, at least one surface of which provides an access plane end perpendicular to the planes of the layers;
   the access plane end of each substrate having a multiplicity of closely-spaced elecrical contact points provided by the ends of the metal leads formed as part of the integrated circuitry on the substrate;
   insulation layers between adjacent substrates to insulate the body of each substrate from adjacent substrates in the stack; and
   insulation covering the entire access plane end of the stacked substrates except for the contact points thereon, and so formed as to prevent current leakage between the contact points and the access plane ends of the substrates;
   the electrical contact points on the access plane ends of the stacked substrates extending through the insulation in order to be individually accessible for contact with electrical conductors external to the stacked substrates.

2. The high-density electronic package of claim 1 wherein the access plane end of the stacked substrates is prepared by a method including the following steps:
   etching the access plane to remove a thin layer of semiconductor substrate material without affecting the electrical contact points on the access plane;
   applying insulation material to cover the etched surface; and
   removing sufficient insulation material from the surface to uncover the electrical contact points.

3. The high-density electronic package of claim 2 wherein the step of etching the access plane is accomplished by a dry process using a gas plasma.

4. The high-density electronic package of claim 2 wherein the insulation material is a material which is applied in liquid form and then cured.

5. The high-density electronic package of claim 4 wherein the insulation material is a curable liquid polymer which is spun on and then cured.

6. The high-density electronic package of claim 5 wherein the insulation material is polyimide.

7. The high-density electronic package of claim 3 wherein the insulation material is a curable liquid polymer which is applied and then cured.

8. A high-density electronic package comprising:
   a plurality of integrated-circuit-providing semiconductor substrates of substantially identical dimensions stacked and secured together to form a multiple layer structure, at least one end of which terminates in an access plane end perpendicular to the planes of the layers;
   the access plane end of each substrate having a multiplicity of closely-spaced electrical contact points provided by the ends of the metal leads formed as part of the integrated circuitry on the substrate;
   insulation layers between adjacent substrates to insulate the body of each substrate from adjacent substrates in the stack;
   insulation covering the entire access plane end of the stacked substrates except for the contact points thereon, and so formed as to prevent current leakage between the contact points and the access plane ends of the substrates;
   the electrical contact points on the access plane ends of the stacked substrates extending through the insulation in order to be individually accessible for contact with electrical conductors external to the stacked substrates; and
   thin film metallization on the access plane end to make electrical contact with the multiplicity of contact points provided by the leads formed as part of the integrated circuitry on the substrates.

9. The high-density electronic package of claim 8 wherein the access plane end of the stacked substrates is prepared by a method including the following steps:
   etching the access plane to remove a thin layer of semiconductor substrate material without affecting the electrical contact points on the access plane;
   applying insulation material to cover the etched surface; and
   removing sufficient insulation material from the surface to uncover the electrical contact points.

10. The high-density electronic package of claim 9 wherein the step of etching the access plane is accomplished by a dry process using a gas plasma.

11. The high-density electronic package of claim 9 wherein the insulation material is a material which is applied in liquid form and then cured.

12. The high-density electronic package of claim 11 wherein the insulation material is a curable liquid polymer which is spun on and then cured.

13. The high-density electronic package of claim 12 wherein the insulation material is polyimide.

14. The high-density electronic package of claim 10 wherein the insulation material is a curable liquid polymer which is applied and then cured.

* * * * *